(12) United States Patent
Yoo

(10) Patent No.: US 6,809,035 B2
(45) Date of Patent: Oct. 26, 2004

(54) HOT PLATE ANNEALING

(75) Inventor: Woo Sik Yoo, Palo Alto, CA (US)

(73) Assignee: WaferMasters, Inc., San Jose, CA (US)

( * ) Notice: Subject to any disclaimer, the term of this patent is extended or adjusted under 35 U.S.C. 154(b) by 0 days.

(21) Appl. No.: 10/211,710

(22) Filed: Aug. 2, 2002

(65) Prior Publication Data

US 2004/0023504 A1 Feb. 5, 2004

(51) Int. Cl.[7] .................... H01L 21/302; H01L 21/461
(52) U.S. Cl. ................. 438/709; 438/909; 438/943
(58) Field of Search .............................. 438/680, 681, 438/685, 709, 785, 909, 943, 907, 908

(56) References Cited

U.S. PATENT DOCUMENTS

| | | | |
|---|---|---|---|
| 4,731,017 A | * | 3/1988 | Echigo et al. |
| 5,252,807 A | | 10/1993 | Chizinsky .................... 219/390 |
| 5,539,855 A | * | 7/1996 | Takahashi et al. |
| 6,133,550 A | | 10/2000 | Griffiths et al. ............. 219/403 |
| 6,301,434 B1 | | 10/2001 | McDiarmid et al. ........ 392/416 |
| 6,331,697 B2 | | 12/2001 | Savas .......................... 219/390 |
| 6,376,806 B2 | * | 4/2002 | Yoo |
| 6,477,787 B2 | * | 11/2002 | Morad et al. |
| 6,537,422 B2 | * | 3/2003 | Sakuma et al. |
| 2001/0047990 A1 | | 12/2001 | Yoo ........................... 219/411 |

FOREIGN PATENT DOCUMENTS

JP          9-153459          10/1997

* cited by examiner

Primary Examiner—Phuc T. Dang
(74) Attorney, Agent, or Firm—MacPherson Kwok Chen & Heid LLP

(57) ABSTRACT

A rapid thermal processor, having a process chamber, including a stable heat source in the form of a heatable mass. Heat is provided to the heatable mass using a series of heating devices. The temperature of the heatable mass establishes the temperature of a semiconductor wafer placed in contact or in close proximity to the heatable mass. To reduce thermal gradients, the heatable mass can be included in an insulative compartment made of an insulating material, such as opaque quartz and the like. The top of the insulative compartment can include an access portion to allow the semiconductor wafer to be placed on the heatable mass disposed therein. During processing, the wafer may be further exposed to a high intensity radiation energy source for a short duration of time.

20 Claims, 5 Drawing Sheets

HOT PLATE ANNEALING

BACKGROUND

1. Field of Invention

The present invention relates to semiconductor processing, and more particularly to method and apparatus for rapid thermal processing of semiconductor substrates.

2. Related Art

The advances in fabrication processes, especially of semiconductor devices of decreased dimensions, have necessitated the development of new processing and manufacturing techniques. One such processing technique is known as Rapid Thermal Processing (RTP), which reduces the amount of time that a semiconductor device is exposed to high temperatures during processing.

In RTP of semiconductor substrates, substrates are exposed to a high temperature environment for a precise amount of time. Most RTP systems use high intensity lamps (usually tungsten-halogen lamps or arc lamps) to heat the substrates within a cold wall furnace. Lamps are used as the energy source because of their low thermal mass, which makes it easy to power them up and down very quickly. The RTP technique, typically includes irradiating the semiconductor substrate or wafer with sufficient power to quickly raise the temperature of the wafer and hold it at that temperature for a time long enough to successfully perform a fabrication process, but which avoids such problems as unwanted dopant diffusion that could otherwise occur at the high processing temperatures.

Unfortunately, conventional lamp-based RTP systems have considerable drawbacks with regard to uniform temperature distribution. Any single variation in the power output from the lamps can adversely affect the temperature distribution across the wafer. In addition, because most lamp-based systems use lamps with filaments, the wafer usually needs to be rotated to ensure that the temperature non-uniformity due to the filament array is not transferred to the wafer during exposure. The moving parts required to rotate the wafer, add to the cost and complexity of the system.

Another particularly troublesome area for maintaining uniform temperature distribution is at the outer edges of the wafer. Most conventional RTP systems have no adequate means to adjust for this type of temperature non-uniformity. As a result, transient temperature fluctuations occur which may cause the formation of slip dislocations in the wafer at high temperatures (e.g. about 1000° C.).

Lamp RTP systems, generally, make repeatability of uniform processing difficult. In most cases, temperature non-uniformities appear near the substrate edges because of the increased surface area. The non-uniformity may produce crystal slip lines on the substrates, particularly near the edges. Temperature non-uniformities may also cause the formation of non-uniform material properties, such as non-uniform alloy content, grain size, and dopant concentration. Non-uniform material properties may degrade the circuitry and decrease yield.

SUMMARY

The present invention provides a processor, having a process chamber, which includes a stable heat source in the form of a heatable mass. Heat is provided to the heatable mass using a heat source, such as a series of heating elements. To avoid contamination of the process that can occur from the use of heating elements, each heating element may be contained in a clear quartz tube. Each quartz tube can be, made to heat the heatable mass to a desired stable temperature. The temperature of the heatable mass establishes the temperature of a semiconductor wafer placed in contact or in close proximity to the heatable mass.

To reduce thermal gradients, the heatable mass can be surrounded with a thermal insulator, which forms an insulative compartment made of an insulating material, such as opaque quartz and the like. The top of the insulative compartment can include an access portion to allow the semiconductor wafer to be placed on the heatable mass disposed therein.

An opening is provided on the process chamber for loading and unloading of wafers to and from the process chamber. A gate valve can be used to seal the opening, if necessary. The gate opens and closes to allow a robotic transport arm to deliver wafers from a supply, to the process chamber. The gate also opens and closes to allow the robotic transport arm to remove treated wafers from the process chamber. Optionally, the top of the process chamber can be provided with a cooling means so as to effectuate a temperature differential between the heatable mass and the top portion of the process chamber.

The heatable mass can include a wafer support mechanism, movably extends through the base of the process chamber and through the heatable mass. The wafer support mechanism can be used to receive a wafer for processing and then move the wafer to a position on or near the heatable mass for heating. After processing, the wafer support mechanism can move the wafer to a position away from the heatable mass to allow the wafer to cool before it is removed from the process chamber. The wafer support mechanism may take the form of a set of lift pins that extend through conduits or holes formed in the heatable mass.

The heatable mass may include a wafer receptacle, which is formed as an indentation on the working surface of the heatable mass. The wafer receptacle is of a slightly larger dimension than the outer dimension of the wafer to allow the wafer to have surface engaging contact with the heatable mass if desired, which helps maintain the uniformity of the temperature across the diameter of the wafer during processing and along the edges of the wafer.

Optionally, the wafer may be further exposed during heating to a very high intensity radiation energy source for a short duration of time, also referred to as a "flash" process. The flash process can be used to raise the temperature of the active layer of the wafer surface beyond the steady-state temperature of the bulk of the wafer body. Thus the flash process is advantageous for implant anneal applications, such as shallow junction, ultra shallow junction, and source drain anneal. The flash process may also be used effectively for thermal donor annihilation, re-crystallization, and impurity doping.

In one aspect of the invention, a thermal processing system is provided including a process chamber which defines an internal cavity. Disposed within the internal cavity is an insulative compartment including a heatable mass. The insulative compartment also includes an access portion provided to allow a semiconductor wafer to be placed proximate to the heatable mass. The system also includes a wafer support mechanism configured to receive the semiconductor wafer and move the semiconductor wafer from between a first position where the semiconductor wafer is proximate to the heatable mass within the insulative compartment and a second position where the semiconductor wafer is distant from the heatable mass outside of the insulative compartment.

In another aspect of the present invention, a thermal processing system is provided including a process chamber having insulating materials and walls and a window, which together define an internal cavity. Within the internal cavity is disposed an insulative compartment including a heatable mass. The insulative compartment further includes an access portion provided thereon configured to receive a semiconductor wafer therethrough. A wafer support mechanism is included in the system and is configured to receive the semiconductor wafer and move the semiconductor wafer from between a first position where the semiconductor wafer is proximate to the heatable mass within the insulative processing area within the chamber and a second position where the semiconductor wafer is distant from the heatable mass outside of the insulative compartment. Further, the system includes a radiation energy source disposed proximate to the window to allow radiation energy to enter the internal cavity and impinge on a surface of the semiconductor wafer.

In yet another aspect of the present invention, a method is provided for thermal processing including providing a process chamber defining an internal cavity; heating a semiconductor wafer by moving the semiconductor wafer proximate to a heatable mass disposed within an insulative compartment; and cooling the semiconductor wafer by moving the semiconductor wafer a distance from the heatable mass to a position outside of the insulative compartment and within the process chamber. In this aspect the heating may further include radiating the semiconductor wafer with radiation energy.

These and other features and advantages of the present invention will be more readily apparent from the detailed description of the preferred embodiments set forth below taken in conjunction with the accompanying drawings.

DETAILED DESCRIPTION

Figure 1:
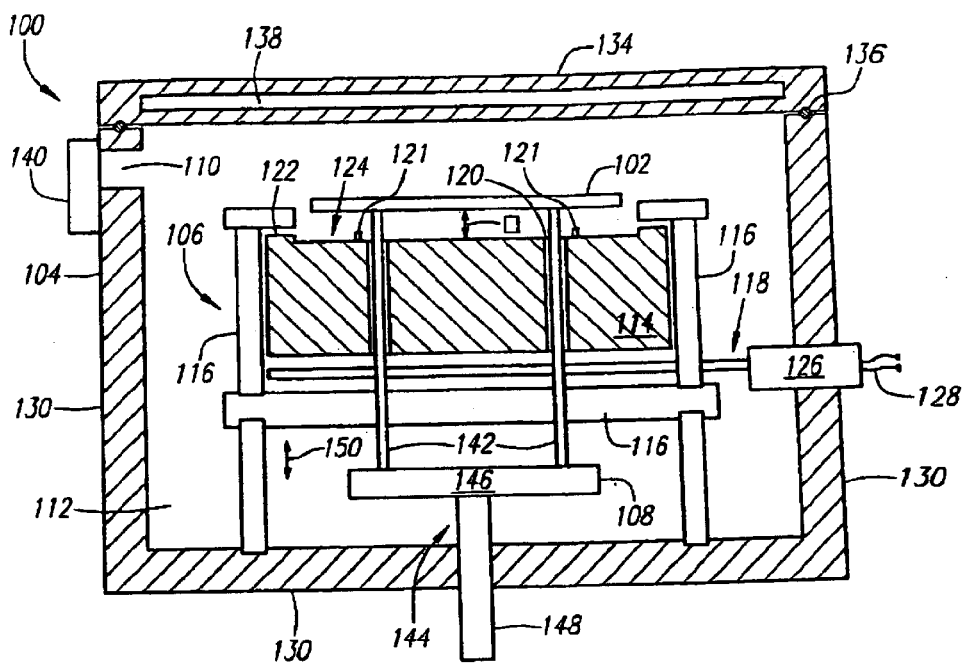
FIG. 1 is a simplified cross-sectional view of a process chamber in accordance with an embodiment of the present invention.

FIG. 1 shows an embodiment of a processor device 100 for the treating and processing of a semiconductor wafer 102, such treatments and processes including but not limited to outgassing, film densification, spin-on dielectric anneal, glass reflow, oxidation, implant anneal, nitridation, copper annealing, silicidation, and dielectric and metal film deposition.

In one embodiment, processor device 100 is a rapid thermal processor device 100, which includes a process chamber 104, a wafer heating assembly 106 and a wafer support assembly 108. A robot wafer loader (not shown), such as a robot arm with an end-effector, can be used to place wafer 102 within chamber 104. In most embodiments, rapid thermal processor device 100 can provide heat to a maximum temperature of about 1400° C. at a rate of at least 20° C./sec, and can be cooled at a rate of at least 20° C./sec.

Process chamber 104 may be a metallic shell, preferably made of aluminum or similar material, which includes walls 130 and a cover 134, which when assembled together define interior cavity 112. In one embodiment, cover 134 may be hingedly coupled to walls 130 or completely removable. In either embodiment, a seal 136, such as an o-ring, can be positioned between walls 130 and cover 134 to provide the capacity to seal interior cavity 112 from an external environment.

In one embodiment, cover 134 can include a cooling means 138, arranged externally or internally. Cooling means 138, such as a water cooled jacket, provides a passive means for removing heat from a wafer placed in relative close proximity to cover 134. Cooling means 138 can also provide an active means for removing heat, such as by allowing cover 134 to be cooled by water or other coolant passing therethrough.

Process chamber 104 includes an opening 110 configured to allow for the loading and unloading of wafer 102 before and after processing. Opening 110 may be a relatively small opening, but with a width large enough to accommodate a wafer of between about 0.5 to 2 mm thick and up to 300 mm (about 12 in.) in diameter, and the robot loader passing therethrough. Opening 110 provides access to interior cavity 112 defined by process chamber 104. In a preferred embodiment, the volume of process chamber 104 is kept small to allow rapid thermal processor device 100 to be kept small, and as a result, rapid thermal processor device 100 can be made more compact, requiring less clean room floor space.

A gate 140 can be configured to provide a closure over opening 110 to isolate interior cavity 112 of process chamber 104. Gate 140 can include a door which is displaceable to permit passage of the robotic arm and end-effector. Circuitry is provided to open and close the door of gate 140, to allow the robotic arm and end-effector to deliver and retrieve wafers, to and from a plurality of displaceable support pins, described in greater detail below.

Process chamber 104 can also be coupled to a pump (not shown) used to evacuate process chamber 104 and a gas inlet (not shown) to allow for the flowing of process or reactant gases into the chamber as required for processing.

Arranged within interior cavity 112 is wafer heating assembly 106. Wafer heating assembly 106 includes a heatable mass or heating plate 114, having a large thermal mass relative to wafer 102, an insulative compartment 116 and heating device 118.

In one embodiment, heating plate 114 is a block of high thermal mass material, such as silicon carbide, quartz, inconel, or other material which will not react or will have only an insubstantial reaction at the anticipated processing temperatures with any ambient gases in process chamber 104 or with wafer 102. Heating plate 114 can be made larger than the anticipated diameter of wafer 102 in the range of between 10% to 50% larger to allow for uniform heating.

In one embodiment, heating plate 114 includes holes or conduits 120 through which displaceable lift pins can be allowed to traverse, as described in greater detail below. In one embodiment, three holes 120 are used to support three separate displaceable lift pins.

In one embodiment, a top or working surface 122 of heating plate 114 is configured to receive wafer 102 in a wafer receptacle 124. In this embodiment, wafer receptacle 124 is formed as an indentation into heating plate 114 a depth slightly larger than the anticipated thickness of wafer 102 and with a diameter slightly larger than the anticipated diameter of wafer 102. The indentation provides a raised edge that extends higher than the edges of wafer 102 to allow for uniform heating at the wafer edge. Wafer 102 maybe placed upon standoffs 121 positioned within receptacle 124. In this event, the depth of receptacle 124 can be made to be greater than the height of standoffs 121 and the thickness of wafer 102 combined.

Figure 2:
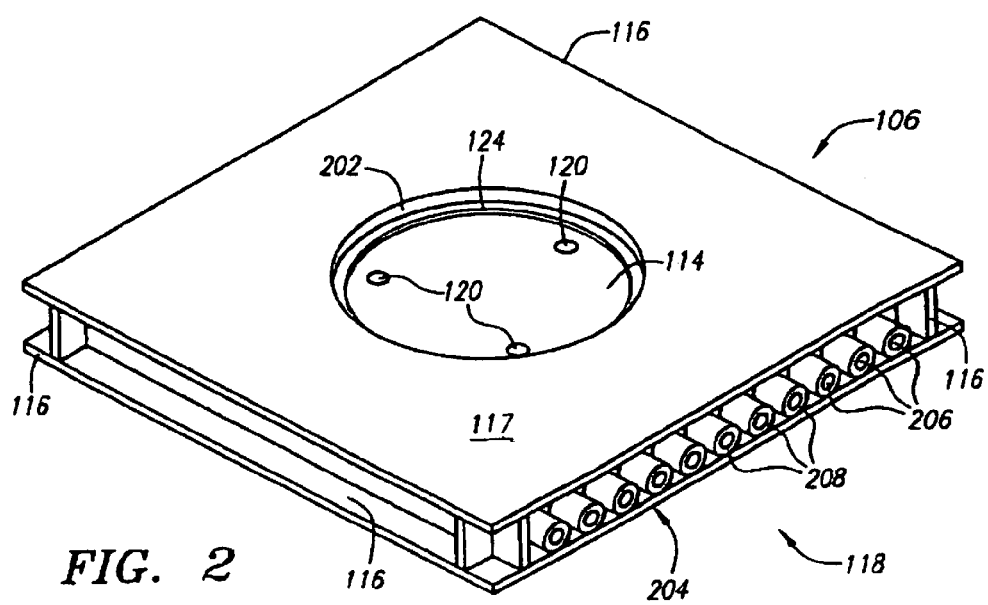
FIG. 2 is a simplified perspective view of a heating assembly in arrangement with an insulative compartment in accordance with an embodiment of the present invention.

Heating plate 114 is surrounded by an insulative material to prevent heat loss from heating plate 114 to the surrounding process chamber walls 130. As shown in FIG. 2, the insulative material is generally formed as an insulative compartment 116 forming an insulative perimeter around heating plate 114. Insulative compartment 116 generally encloses heating plate 114; with an access portion 202 defined through a top surface 117 of insulative compartment 116 directly above wafer receptacle 124. Access portion 202 can have a diameter slightly larger than the anticipated diameter of wafer receptacle 124. Insulative compartment 116 can be made of any appropriate insulative material, such as opaque quartz and the like.

As shown in FIG. 2, within the confines of insulative compartment 116 and proximate to heating plate 114 is positioned heating assembly 118. In one embodiment, heating assembly 118 includes a heat source 204 coupled to a temperature control means 126 (FIG. 1). In one embodiment, heat source 204 may be at least one to a plurality of resistive heating elements 206 or other conductive/radiant heating devices 206, which can be made to stand-off from, be in contact with or be embedded within heating plate 114. Resistive heating elements 206 may be made of any high temperature rated material, such as a suitable resistively heatable wire, which is made from a high mass material for increased thermal response and high temperature stability, such as SiC, SiC coated graphite, graphite, AlCr, AlNi and other alloys. One type of suitable resistive heating element 206 is available from Omega Engineering Inc. of Stamford, Conn.

As shown in FIG. 2, in one embodiment, each resistive heating element 206 can be disposed within and surrounded by a clear quartz tube 208. Quartz tube 208 can be a cylindrically shaped tube made of any suitable dimensions, for example, with a internal diameter of between about 4 mm and 8 mm and an outside diameter of between about 8 mm and 12 mm. Quartz tube 208 provides protection from metal contamination and oxidation, which can occur during processes. For example, using quartz tube 208, processes conducted in process chamber 104 can occur free of exposure to contaminating particles, which may otherwise burn free from each heating element 206 and into the chamber processing environment. In addition, processes which typically use oxygen can be conducted within process chamber 104 without fear of oxidizing heating elements 206.

The temperature of heating plate 114 may be controllable by controlling heat source 204 to provide a variable temperature depending on the application. Control means 126 can be a conventional temperature controller, such as is typically used to adjust the temperature of resistive heating elements. Electrical leads 128 (FIG. 1), which extend outside of process chamber 104, can be provided between an electrical power source (not shown) and control means 126. Control means 126 applies the appropriate current to heating elements 206 to provide the desired heating. The power source may be a direct line voltage of between about 100 volts and about 500 volts.

In one embodiment, the temperature of heating plate 114 may be varied between about 50° C. and about 1500° C., preferably between about 100° C. and about 1200° C. for both low and high temperature applications. Once heating plate 114 is heated to a desired temperature, however, the temperature of heating plate 114 can be kept uniform and consistent.

Referring again to FIG. 1, wafer support assembly 108 includes a plurality of displaceable wafer support pins 142, preferably three displaceable wafer support pins, and a wafer elevation means 144. In one embodiment, wafer elevation means 144 can include a support base 146 and a driver 148, and can be used to raise and lower wafer 102 away from and proximate to heating plate 114 at a predetermined rate of speed.

As previously mentioned an arrangement of holes 120 are provided disposed through heating plate 114 and heating assembly 118. Wafer support pins 142 extend through each hole 120 in a slidingly sealed manner. Wafer support pins 142 are coupled to support base 146 of elevation means 144. Driver 148 causes base support 146 to move up and down in the direction of arrow 150 to displace wafer support pins 142 as desired. Driver 148 may include any linear actuation device, such as a powered lead screw, a hydraulic or pneumatic lift or other lift means.

In one embodiment, elevation means 144 can displace wafer 102 a distance h from heating plate 114 at a desired rate of speed. For example, distance h can range from between 0.05 mm and 100 mm. The displacement can occur at a velocity of between about 1 mm/sec and 10 mm/sec, for example, 5 mm/sec. The actual distance h and rate of speed that wafer 102 is raised above heating plate 114 can be customized to deliver a predetermined rate of wafer cooling.

Figure 3A:
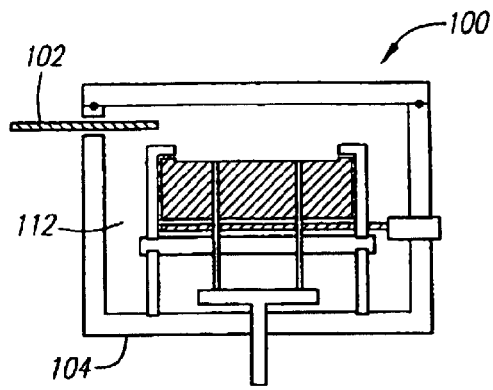
FIGS. 3A–3F are simplified cross-sectional views of a process involving the process chamber of FIG. 1 in accordance with an embodiment of the present invention.
Figure 3B:
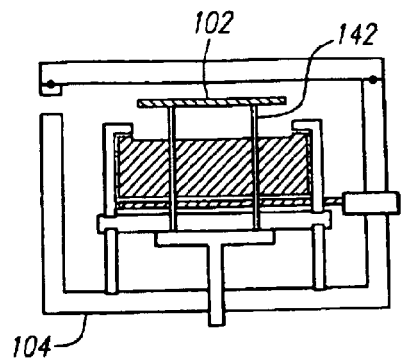

FIGS. 3A–3F provide an illustration of an operational mode of rapid thermal processor device 100. The robotic arm and end-effector (not shown) deliver wafer 102 to interior cavity 112 (FIG. 3A) and position wafer 102 on wafer support pins 142 (FIG. 3B). Elevation means 148 displaces wafer support pins 142 so as to lower wafer 102 onto heating plate 114 (FIGS. 3C and 3D) for processing. Depending on the application, lowering wafer 102 onto heating plate 114 can include allowing wafer 102 to contact heating plate 114 or else may include holding wafer 102 slightly above heating plate 114 using standoffs 121 or else by allowing a portion of wafer support pins 142 to remain outside of holes 120. For example, wafer 102 can be held or placed upon standoffs 121 a distance between about 0.05 mm and 5 mm above heating plate 114.

Figure 3C:
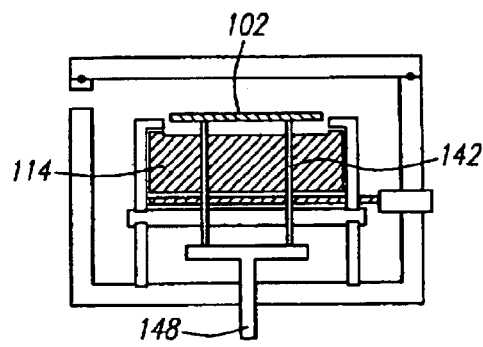
Figure 3D:
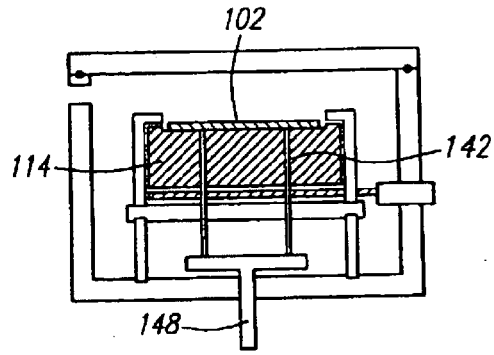
Figure 3E:
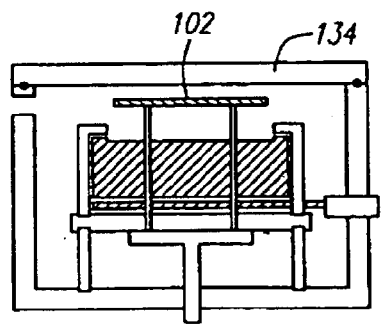

After the processing of wafer 102 is complete or at any time as desired, wafer 102 is elevated using elevation means 148 away from heating plate 114 (FIG. 3E). In one example, with no intention to limit the invention, wafer 102 can be moved a distance of 2 mm to 100 mm at a rate of speed of 1 mm/sec to about 1000 mm/sec above heating plate 114 to allow for a desired rate of cooling of greater than 10° C./sec. In one embodiment, cover 134 can be made to have a temperature between about −20° C. and about 300° C., which increase the rate of cooling even further.

Figure 3F:
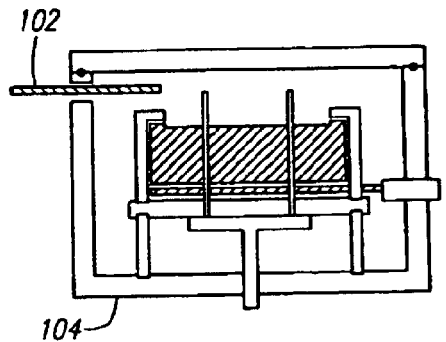

Once the temperature of wafer 102 has been uniformly reduced to below a critical temperature of about 50° C. to about 200° C. lower than process temperature, wafer 102 can be removed from process chamber 104 (FIG. 3F).

Figure 4:
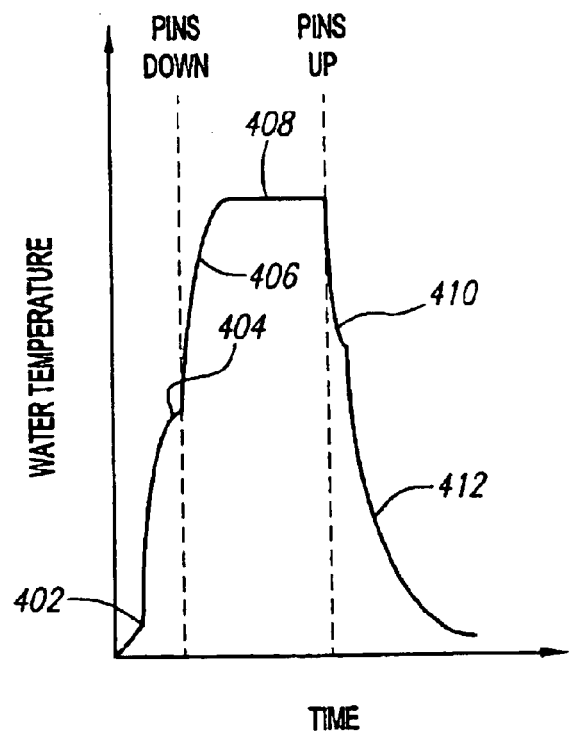
FIG. 4 is a graph representing the wafer temperature time profile at various stages in the process illustrated in FIGS. 3A–3F.

FIG. 4 is a graph representing the wafer temperature profile at various times 402 to 412, during the process described in FIGS. 3A–3F. As shown, the wafer temperature rises (402, 404) as wafer 102 is moved into process chamber 104 and positioned on wafer support pins 142 (FIGS. 3A and 3B). The wafer temperature continues to rise (406) as wafer support pins 142 are lowered to bring wafer 102 into closer proximity to heating plate 114 (FIG. 3C). Once wafer 102 is positioned on or near heating plate 114, the temperature stabilizes (408) at the process temperature (FIG. 3D). Processing can continue for any desired period of time, for example, between about 5 seconds to about 600 seconds. Once processing is complete, wafer support pins 142 are raised to move wafer 102 away from heating plate 114 (FIG. 3E). The temperature of wafer 102 begins to drop (410, 412) to below a critical temperature. Wafer 102 can then be removed from process chamber 104 (FIG. 3F).

Figure 5:
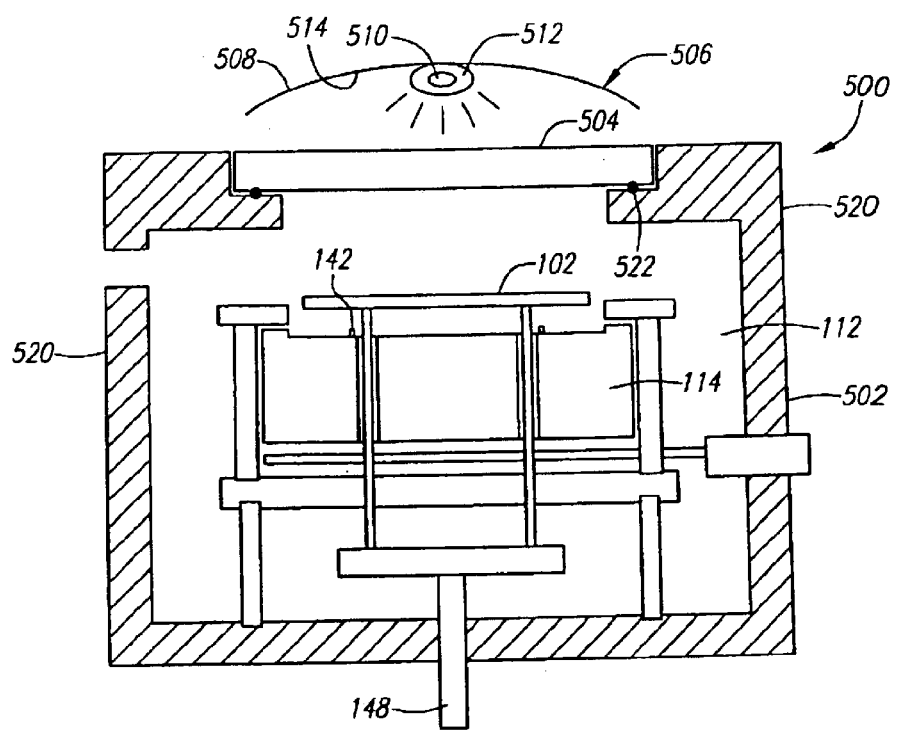
FIG. 5 is a simplified cross-sectional view of a process chamber in accordance with an embodiment of the present invention.

FIG. 5 shows an embodiment of a rapid thermal processor device 500 for the treatment of semiconductor wafer 102. Process chamber 502 includes the same components as described above with regard to process chamber 104 to provide substantially the same functions, with the exceptions noted below.

In this embodiment, process chamber 502 includes a window 504, which may be sized to expose the full diameter of wafer 102 to an external radiation energy source. Window 504 allows radiation energy to enter process chamber 502 and impinge on wafer 102. Window 504 may be made of any material that allows for the transmission of radiation energy; preferably transparent quartz. In some embodiments, window 504 may have a thickness of between about 1 mm and about 5 mm and a diameter that is at least as great as or greater than wafer 102. In one embodiment, window 504 may be hingedly coupled to walls 520 of process chamber 502 or else completely removable. In either embodiment, a seal 522, such as an o-ring, can be positioned at an interface between walls 520 and window 504 to provide the capacity to seal interior cavity 112 from an external environment.

As shown in FIG. 5, process chamber 502 may be positioned proximate to a reflector assembly 506. Reflector assembly 506 may include a reflector 508 and a radiation energy source 510.

Reflector 508 is in operational arrangement with wafer 102. In one embodiment, reflector 508 includes an inner surface 514, which can be highly reflective of certain wavelengths and absorptive or non-reflective of others. In one embodiment, inner surface 514 can be coated with a material, which has these reflecting/absorbing characteristic. For example, inner surface 514 may be coated with gold or silver, where the silver is further coated with a protection coating, such as SiN or any transparent coating, which prohibits oxidation of the silver. The coating efficiently reflects wavelengths of less than 900 nm, to produce an average wavelength of between about 900 nm and about 200 nm. In another embodiment, inner surface 514 is highly reflective across the full spectra of ultra violet (UV), infrared (IR) and visible wavelengths.

Reflector 508 may be formed into any suitable geometric shape. For example, reflector 508 may be flat, spherical, elliptical or parabolic. Radiation energy source 510 can be focused at the center or focal point of reflector 508 to be directed toward wafer 102. The radiation emitted from radiation energy source 510 and reflected from inner surface 514 of reflector 506 impinges on wafer 102 to provide a uniform temperature distribution across the surface of wafer 102.

In one embodiment, radiation energy source 510 can be a high-intensity lamp of the type conventionally used in lamp heating operations. In this embodiment, radiation energy source 510 is a filament-less lamp, such as a Xe arc lamp (hereinafter "lamp 510"). Lamp 510 can be any suitably shaped lamp, for example, a tube shaped lamp that has a length at least as long as the diameter of wafer 102. Optionally, lamp 510 can be surrounded by a flow tube 512. Flow tube 512 can contain a cooling fluid, for example, deionized water. The cooling fluid is used to keep lamp 510 from overheating during operation. For example, the cooling fluid can keep the temperature of lamp 510 under 100° C. to keep any quartz components of lamp 510 from melting. In another embodiment, the cooling fluid can be mixed with a non-conductive die. The non-conductive die can act as a filter to keep only certain wavelengths from emanating from lamp 510 through flow tube 512.

The temperature to which the surface of wafer 102 is heated as a result of the exposure to lamp 510 is a function of the relationship between the power supplied to lamp 510 and the length of time which the radiation energy is allowed to impinge on the wafer surface. In one embodiment, the temperature of wafer surface 503 (or active layer 503) may be raised to a range from between about 500° C. to about 1400° C. To achieve these temperatures, wafer 102 may be exposed to a "flash" of lamp 510. The flash refers to lamp 510 giving off radiation energy suddenly or substantially instantaneously, for example, for a duration of time between about 1 nanosecond and about 10 seconds at a power level of between about 0.5 J/cm$^2$ and about 100 J/cm$^2$. A type reactor system that uses a flash technique is described in commonly assigned U.S. Pat. Ser. No. 09/910,298, filed Jul. 20, 2001, now U.S. Pat. No. 6,376,806, which is herein incorporated for all purposes.

Figure 6A:
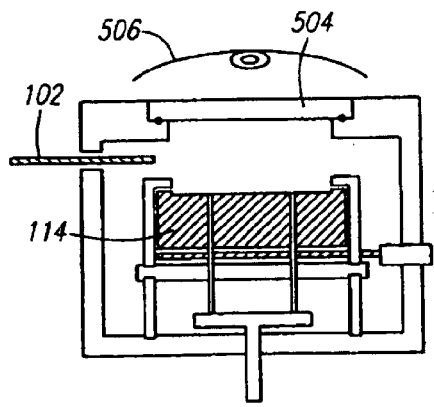
FIGS. 6A–6G are simplified cross-sectional views of a process involving the process chamber of FIG. 5 in accordance with an embodiment of the present invention.
Figure 6B:
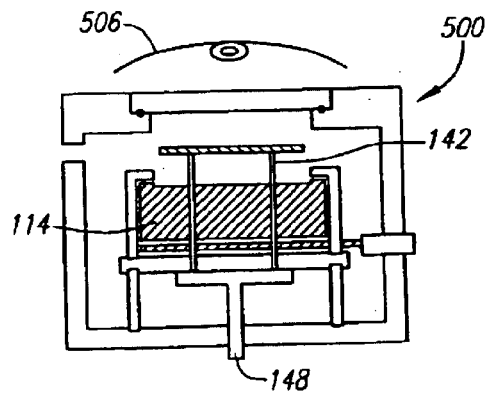

FIGS. 6A–6G are simplified illustrations of an operational embodiment of process chamber 502 in accordance with the present invention. The robotic arm and end-effector (not shown) deliver wafer 102 to interior cavity 112 (FIG. 6A) and position wafer 102 on wafer support pins 142 (FIG. 6B). Elevation means 148 displaces wafer support pins 142 so as to lower wafer 102 onto or near heating plate 114 (FIGS. 6C and 6D) for processing.

Figure 6C:
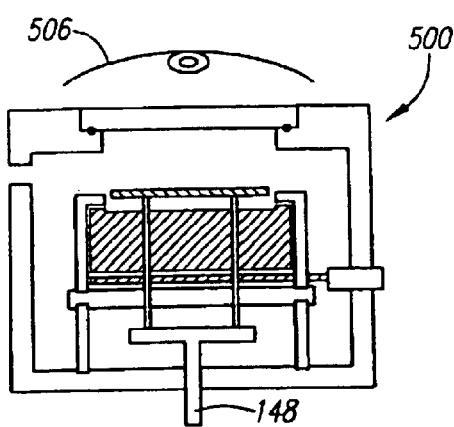
Figure 6D:
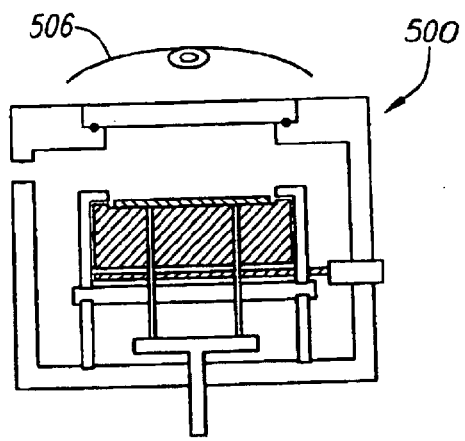
Figure 6E:
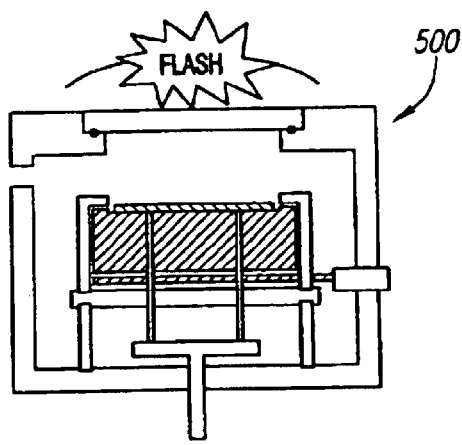

As shown in FIG. 6E, lamp 510 of reflector assembly 506 is made to flash to further raise the temperature of wafer surface 503. In this embodiment, the duration of the flash may be between about 10 msec and about 1000 msec to increase the temperature of wafer surface 503 from between about 10° C. and about 1000° C. during the flash.

Figure 6F:
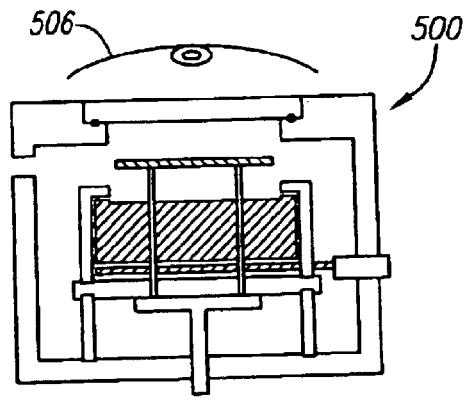

After the processing of wafer 102 is complete or at any time as desired, wafer 102 is elevated using elevation means 148 away from heating plate 114 (FIG. 6F).

Figure 6G:
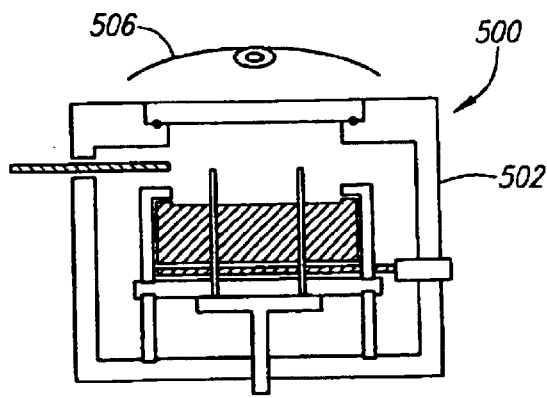

Once the temperature of wafer 102 has been uniformly reduced to below a critical temperature 50° C. to about 200° C. lower than the steady-state temperature of the bulk wafer body, wafer 102 can be removed from process chamber 502 (FIG. 6G).

Figure 7:
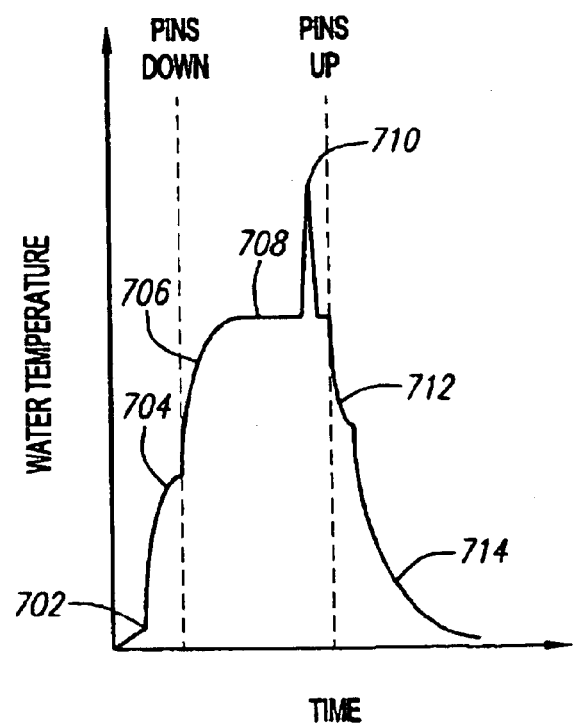
FIG. 7 is a graph representing the wafer temperature time profile at various stages in the process illustrated in FIGS. 6A–6G.

FIG. 7 is a graph representing the wafer temperature profile at various times 702 to 714, during the process described in FIGS. 6A–6G. As shown, the wafer temperature rises (702, 704) as wafer 102 is moved into process chamber 504 and positioned on wafer support pins 142 (FIGS. 6A and 6B). The wafer temperature continues to rise (706) as wafer support pins 142 are lowered to bring wafer 102 into closer proximity to heating plate 114 (FIG. 6C). Once wafer 102 is positioned on or near heating plate 114, the temperature stabilizes or reaches a steady-state temperature (708) at a first processing temperature (FIG. 6D). Processing can continue for any desired period of time, for example between about 5 seconds to about 600 seconds. During the processing, wafer 102 can be flashed through window 504 using reflector assembly 506 (FIG. 6E). Flashing wafer 102 for a duration of time, for example, between 10 msec and 1000 msec, increases the temperature of wafer surface 503 to a second processing temperature (710).

Once processing is complete, wafer support pins 142 are raised to move wafer 102 away from heating plate 114 (FIG. 6F). The temperature of wafer 102 begins to drop (712) to below a critical temperature. Wafer 102 can then be removed from process chamber 502, which continues the cooling (714) of the wafer (FIG. 6G).

Having thus described embodiments of the present invention, persons skilled in the art will recognize that changes may be made in form and detail without departing from the scope of the invention. Thus the invention is limited only by the following claims.

What is claimed is:

1. A semiconductor processing system comprising:
    a process chamber defining an internal cavity;
    an insulative compartment disposed within said internal cavity having an access portion defined through a top surface to provide access to a heatable mass disposed within said insulative compartment and below said top surface, said insulative compartment; and
    a wafer support mechanism configured to receive a semiconductor wafer and move said semiconductor wafer from between a first position where said semiconductor wafer is proximate to said heatable mass and within said insulative compartment and a second position where said semiconductor wafer is distant from said beatable mass and outside of said insulative compartment.

2. The system of claim 1, wherein said process chamber comprises a cover, wherein said cover is actively cooled and wherein said second position positions said semiconductor wafer between about 1 mm to about 100 mm distance from said actively cooled cover.

3. The system of claim 1, wherein said process chamber comprises a cover, wherein said cover comprises a clear quartz window.

4. The system of claim 1, wherein said heatable mass is heated using a plurality of heating elements positioned within said insulative compartment.

5. The system of claim 4, wherein said plurality of heating elements are each enclosed within a quartz tube.

6. The system of claim 1, wherein said wafer support mechanism comprises at least three wafer support pins, said wafer support pins being slidably moveable through said beatable mass.

7. The system of claim 1, wherein said insulative compartment comprises walls of opaque quartz.

8. The system of claim 1, wherein said wafer support mechanism moves said semiconductor wafer from between said first position where said semiconductor wafer is between about 0.05 mm and about 100 mm distance from said heatable mass within said insulative compartment and said second position where said semiconductor wafer is between about 0.1 mm and 100 mm distance from said heatable mass outside of said insulative compartment.

9. A wafer processing system comprising:
    a process chamber including walls and a window defining an internal cavity;
    an insulative compartment including a heatable mass disposed within said internal cavity,
    a wafer support mechanism configured to receive a semiconductor wafer and move said semiconductor wafer from between a first position where said semiconductor wafer is proximate to said heatable mass within said insulative compartment and a second position where said semiconductor wafer is distant from said heatable mass outside of said insulative compartment; and
    a radiation energy source disposed proximate to said window to allow radiation energy to enter said internal cavity and impinge on a surface of said semiconductor wafer.

10. The system of claim 9, wherein said window comprises a clear quartz window.

11. The system of claim 9, wherein said heatable mass is heated using a plurality of heating elements positioned within said insulative compartment.

12. The system of claim 11, wherein said plurality of heating elements are each enclosed within a quartz tube.

13. The system of claim 9, wherein said wafer support mechanism comprises at least three wafer support pins, said wafer support pins being slidably moveable through said heatable mass.

14. The system of claim 9, wherein said insulative compartment walls comprise walls of opaque quartz.

15. The system of claim 9, wherein said wafer support mechanism moves said semiconductor wafer from between said first position where said semiconductor wafer is between about 0.05 mm and about 100 mm distance from said heatable mass within said insulative compartment and said second position where said semiconductor wafer is between about 0.05 mm and 100 mm distance from said heatable mass outside of said insulative compartment.

16. The system of claim 9, wherein said radiation energy source can be configured to be flashed to substantially instantaneously raise the temperature of said semiconductor wafer.

17. A method for wafer processing comprising:
    providing a process chamber defining an internal cavity, and an insulative compartment disposed within said internal cavity;
    moving a semiconductor wafer from between a first position where said semiconductor wafer is proximate to a heatable mass disposed within said insulative compartment and a second position where said semiconductor wafer is distant from said heatable mass outside of said insulative compartment; and
    cooling said semiconductor wafer by moving said semiconductor wafer a distance from said heatable mass to a position outside of said insulative compartment and within said process chamber.

18. The method of claim 17 wherein said heating further comprises radiating said semiconductor wafer with radiation energy.

19. The method of claim 18, wherein said radiating comprises flashing said semiconductor wafer with high intensity light energy.

20. The method of claim 17, wherein said cooling further comprises moving said semiconductor wafer said distance from said heatable mass to said position outside of said insulative compartment, within said process chamber and proximate to an actively cooled cover of said process chamber.

* * * * *